(12) United States Patent
Abou-Khalil et al.

(10) Patent No.: US 9,978,849 B2
(45) Date of Patent: May 22, 2018

(54) SOI-MOSFET GATE INSULATION LAYER WITH DIFFERENT THICKNESS

(71) Applicant: GLOBALFOUNDRIES INC., Grand Cayman (KY)

(72) Inventors: Michel J. Abou-Khalil, Essex Junction, VT (US); Alan Bernard Botula, Essex Junction, VT (US); Blaine Jeffrey Gross, Essex Junction, VT (US); Mark David Jaffe, Shelburne, VT (US); Alvin Joseph, Williston, VT (US); Richard A. Phelps, Colchester, VT (US); Steven M. Shank, Jericho, VT (US); James Albert Slinkman, Montpelier, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 14/982,459

(22) Filed: Dec. 29, 2015

(65) Prior Publication Data

US 2017/0186845 A1    Jun. 29, 2017

(51) Int. Cl.
| | |
|---|---|
| *H01L 29/423* | (2006.01) |
| *H01L 29/06* | (2006.01) |
| *H01L 29/78* | (2006.01) |
| *H01L 29/66* | (2006.01) |
| *H01L 21/28* | (2006.01) |

(52) U.S. Cl.
CPC .. *H01L 29/42376* (2013.01); *H01L 21/28017* (2013.01); *H01L 29/0649* (2013.01); *H01L 29/42368* (2013.01); *H01L 29/66568* (2013.01); *H01L 29/78* (2013.01)

(58) Field of Classification Search
CPC ........... H01L 29/42368; H01L 29/7856; H01L 29/42376
See application file for complete search history.

(56) References Cited

U.S. PATENT DOCUMENTS

| | | | |
|---|---|---|---|
| 4,484,209 A | * | 11/1984 | Uchida ................... H01L 21/86 257/353 |
| 4,732,871 A | | 3/1988 | Buchmann et al. |
| 5,573,965 A | | 11/1996 | Chen et al. |
| 5,610,430 A | | 3/1997 | Yamashita et al. |

(Continued)

*Primary Examiner* — Anh Mai
(74) *Attorney, Agent, or Firm* — Gibb & Riley, LLC; Michael J. LeStrange, Esq.

(57) ABSTRACT

Methods form transistor structures that include, among other components, a substrate having an active region bordered by an isolation region, a gate insulator on the substrate, and a gate conductor on the gate insulator. First and second sections of the gate conductor are within the active region of the substrate, while a third section is in the isolation region of the substrate. The second section of the gate conductor tapers from the width of the first section to the width of the wider third section. The first section and the second section of the gate conductor have undercut regions where the corner of the gate conductor contacts the substrate. The third section of the gate conductor lacks the undercut regions. The gate insulator is relatively thicker in the undercut regions and is relatively thinner where the corner of the gate conductor lacks the undercut regions in the isolation region.

11 Claims, 12 Drawing Sheets

(56) References Cited

U.S. PATENT DOCUMENTS

| | | | |
|---|---|---|---|
| 5,681,768 A * | 10/1997 | Smayling | H01L 29/0847 |
| | | | 257/E21.427 |
| 5,994,747 A | 11/1999 | Wu | |
| 6,551,883 B1 | 4/2003 | Yen et al. | |
| 6,642,579 B2 * | 11/2003 | Fung | H01L 29/78612 |
| | | | 257/347 |
| 6,774,000 B2 | 8/2004 | Natzle et al. | |
| 7,618,868 B2 | 11/2009 | Yoo et al. | |
| 7,736,956 B2 | 6/2010 | Datta et al. | |
| 7,829,945 B2 | 11/2010 | Adkisson et al. | |
| 8,659,080 B2 | 2/2014 | Chin et al. | |
| 2014/0159141 A1 | 6/2014 | Arthur et al. | |

\* cited by examiner

SOI-MOSFET GATE INSULATION LAYER WITH DIFFERENT THICKNESS

BACKGROUND

The present disclosure relates to methods for forming transistors and transistor devices, and more specifically, to transistor devices that utilize selective undercut at the corner where the gate conductor contacts the gate insulator to control performance characteristics.

Integrated circuit transistors perform many useful functions within modern electronic devices. Such devices come in many shapes, types, and sizes; and diverse manufacturing processes have been developed in order to make transistors more efficient, more reliable, less expensive, and smaller.

For example, the switching performance of radio frequency (RF) field effect transistor (FET) devices can be optimized by reducing overlap capacitance and increasing breakdown voltage. Technical solutions that improve these parameters, such as thicker gate oxide or reduced extension implant dose, are detrimental to other switch device metrics, such as high linear drive current (low on-resistance). These parameters define one design trade-off space for field effect transistors used in radio frequency switching applications.

SUMMARY

Exemplary transistor structures herein include, among other components, a substrate having an active region bordered by an isolation region (e.g., shallow trench isolation) and potentially a body contact region. The active region has a channel area, a source area, and a drain area. The channel area is between the source area and the drain area relative to a first plane that is horizontal and parallel to the top surface of the substrate. The channel area is an area of the substrate doped as a semiconductor, and the source area and the drain area are areas of the substrate doped as conductors. Additionally, a gate insulator is on (and contacts) the channel area, and a gate conductor is on (and contacts) the gate insulator. The gate insulator is between the gate conductor and the channel area relative to a second plane that is vertical plane and perpendicular to the horizontal plane.

The gate conductor extends from the active region to the isolation region relative to the horizontal plane. The gate conductor has a first section, a second section, and a third section. The second section of the gate conductor is between the first section and the third section of the gate conductor relative to the horizontal plane. The first section of the gate conductor is within the active region and has a first width relative to the horizontal plane. The third section of the gate conductor is within the isolation region and has a second width relative to the horizontal plane that is greater than the first width. The third section of the gate conductor is a location for formation of electrical contacts to the gate conductor. The second section of the gate conductor is within the active region and has a tapered width relative to the horizontal plane that tapers from the first width to the second width.

The first section and the second section of the gate conductor have undercut regions where the corner of the gate conductor contacts the gate insulator. The third section of the gate conductor lacks the undercut regions. The gate conductor has sides, one of the sides is oriented toward the source area and another of the sides is oriented toward the drain area, and the undercut regions may be on both sides of the gate conductor, or may only be on one of the sides of the gate conductor (e.g., only on the drain side or the source side). The gate insulator is relatively thicker in the undercut regions and is relatively thinner where the corner of the gate conductor lacks the undercut regions (in the isolation region).

The size of the undercut regions, and the difference in thickness of the gate insulator in the undercut regions relative to where the corner of the gate conductor lacks the undercut regions in the isolation region, control overlap capacitance, breakdown voltage, and gate-induced drain leakage current of the transistor structure.

Additionally, such transistor structures can include a second gate conductor positioned perpendicular to the gate conductor (within the horizontal plane). The second gate conductor connects gate conductors of adjacent transistor structures. Similarly, a second gate insulator contacts and is between the substrate and the second gate conductor. The second gate conductor has a fourth section within the active region and a fifth section within a floating or body contact region. The fourth section of the gate conductor has undercut regions where the second gate conductor contacts the second gate insulator. As with the other undercut regions, the second gate insulator is thicker in the undercut regions and is relatively thinner where the second gate conductor lacks the undercut regions in the fifth section within the body contact region. The undercut region reduces capacitance under the gate between active region and the body contact region.

Exemplary methods herein form a transistor structure by, among other actions, doping (providing impurities to) a substrate to form an active region bordered by an isolation region and potentially a body contact region, and doping the active region to form a channel area. These methods grow a gate insulator directly on the channel area, and pattern a gate conductor directly on the gate insulator. The gate insulator is between (and directly, physically contacts) the gate conductor and the channel area. The gate conductor is patterned to extend from the active region to the isolation region.

This processing patterns the gate conductor to have a first section, a second section, and a third section. The second section of the gate conductor is between the first section and the third section of the gate conductor (in the horizontal plane). The first section of the gate conductor is within the active region and has a first width. The third section of the gate conductor is within the isolation region and has a second width that is greater than the first width, and the second section of the gate conductor is within the active region and has a tapered width that tapers from the first width to the second width.

These methods form undercut regions in the first section and the second section of the gate conductor, where the corner of the gate conductor contacts the gate insulator. Undercut regions are not formed in the third section of the gate conductor (by way of a mask protecting the third section during the undercutting process). Then, such methods form additional amounts of the gate insulator in the undercut regions. The gate insulator is relatively thicker in the undercut regions and is relatively thinner where the corner of the gate conductor lacks the undercut regions in the isolation region. Again, the size of the undercut regions, and the difference in thickness of the gate insulator in the undercut regions relative to where the corner of the gate conductor lacks the undercut regions in the isolation region, control overlap capacitance, breakdown voltage, and gate-induced drain leakage current of the transistor structure.

In later processing, these methods dope the active region to have a source area and a drain area (the channel area is between the source area and the drain area), and such processing can form electrical contacts to the third section of the gate conductor. The gate conductor has sides, one of the sides is oriented toward the source area and another of the sides is oriented toward the drain area, and the undercut regions may be formed on both sides of the gate conductor, or may only be formed on one of the sides of the gate conductor (e.g., only on the drain side or the source side).

The process of growing the gate insulator may grow gate insulator in a second area (may grow a second gate insulator). Correspondingly, the patterning of the gate conductor may pattern additional conductive material (e.g., may pattern a second gate conductor positioned perpendicular to the gate conductor). Again, the second gate insulator contacts and is between the substrate and the second gate conductor. The second gate conductor is patterned to connect gate conductors of adjacent transistor structures.

The second gate conductor is patterned to have a fourth section within the active region and a fifth section within a floating or body contact region. The process of forming undercut regions forms the fourth section of the gate conductor to have undercut regions where the second gate conductor contacts the second gate insulator, but this undercut processing masks the fifth section of the gate conductor to avoid forming undercut regions. Also, the process of forming additional amounts of the gate insulator in the undercut regions forms the second gate insulator thicker in the undercut regions and relatively thinner where the second gate conductor lacks the undercut regions (in the isolation region and body contact region). The undercut region also reduces capacitance under the gate between active region and the body contact region.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
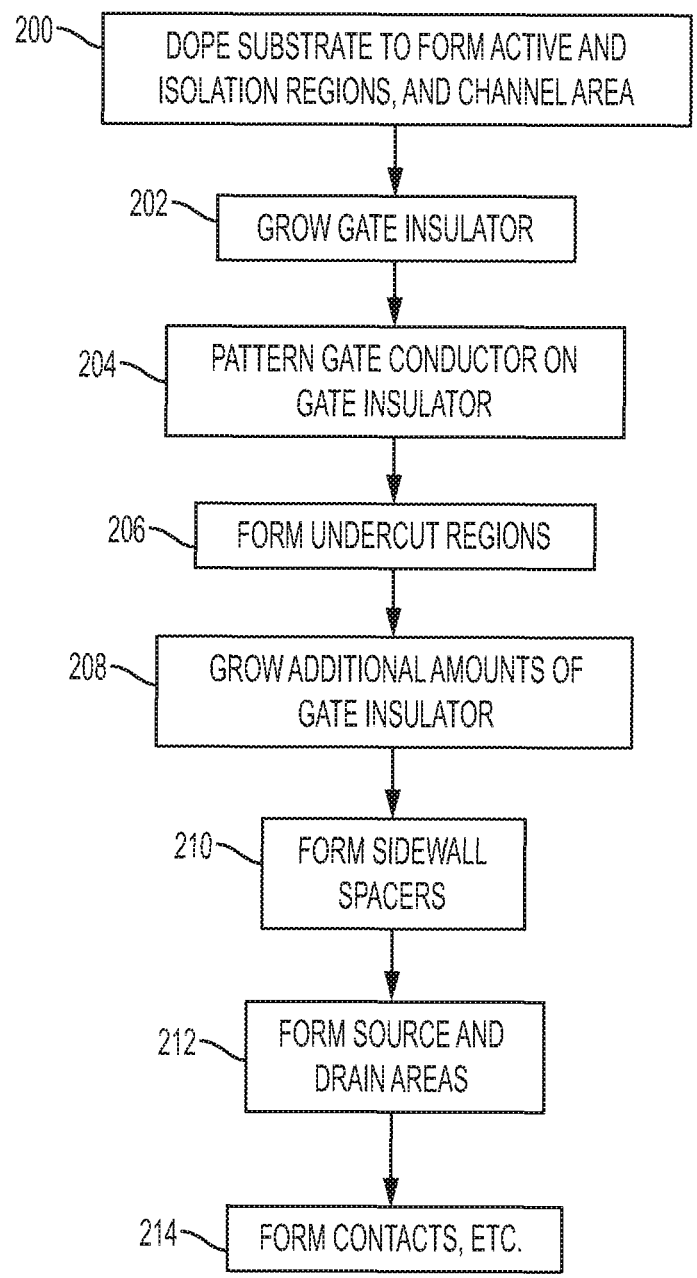
FIG. 1 is a flow diagram illustrating embodiments herein.

As noted above, radio frequency (RF) field effect transistor (FET) devices can be optimized by reducing overlap capacitance and increasing breakdown voltage, and technical solutions that improve these parameters, such as thicker gate oxide or reduced extension implant dose, are detrimental to other switch device metrics, such as high linear drive current (low on-resistance). Devices and methods herein provide a structure that improves capacitance and breakdown, while exacting less of a penalty or no penalty to on-resistance, providing radio frequency switches that have improved overall performance. The device structures disclosed also reduce gate-induced drain leakage current, which degrades switch linearity.

The gate conductor edges or corners, that is the gate conductor region that contacts the gate insulator and is adjacent to the source and drain, are high field regions that play a significant role in overlap capacitance, breakdown voltage, and gate-induced drain leakage current. The methods and devices described herein create a thicker gate oxide only at the edges (e.g., corners) of the gate conductor, much thicker than is achieved by the bird's beak created by gate sidewall oxidation. This thicker oxide lowers the peak electric field, leading to higher breakdown voltage and reduced gate-induced drain leakage current, and reduces the overlap capacitance because of the thicker local dielectric. The device on-resistance is affected less since the gate oxide is substantially thinner in the main channel region than it is at the device edges.

The same reference numbers identify the same or similar features in all drawings. As shown in flowchart form in FIG. 1, and various views schematically in FIGS. 2-23, exemplary methods herein form a transistor structure by, among other actions, doping (providing impurities to) a substrate 100 (FIG. 2) to form an active region 182 bordered by an insulating isolation region 180 and potentially a body contact region 184 (as shown in FIGS. 8A-9C, and in item 200 in FIG. 1). Therefore, item 184 can simply represent additional isolation region, or a body contact region, depending upon specific design. For example, in the isolation region 180 in FIGS. 8A-9C can be a shallow trench isolation (STI) region.

Figure 5:
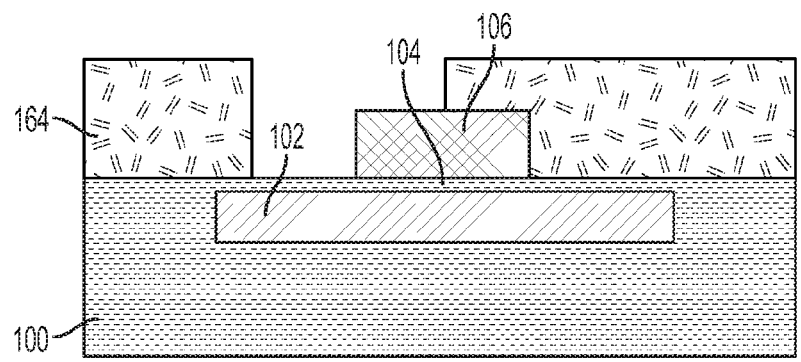
FIG. 5 is a schematic cross-sectional diagram of an integrated circuit device according to embodiments herein.
Figure 6:
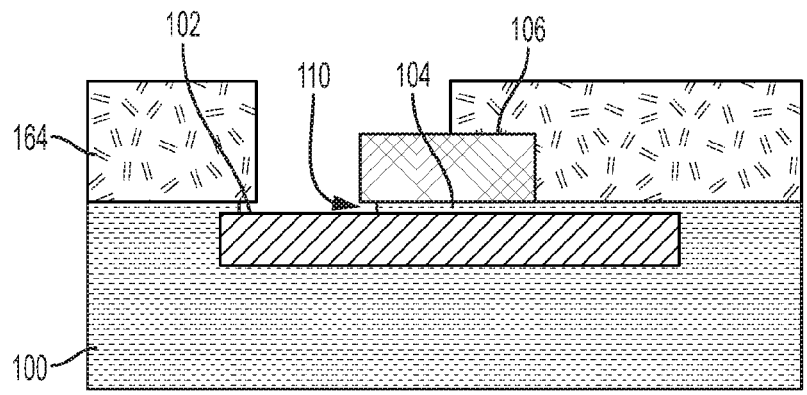
FIG. 6 is a schematic cross-sectional diagram of an integrated circuit device according to embodiments herein.
Figure 7:
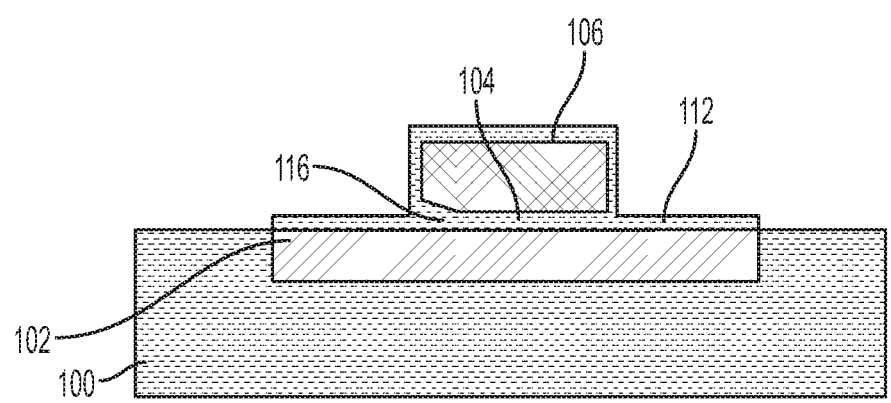
FIG. 7 is a schematic cross-sectional diagram of an integrated circuit device according to embodiments herein.
Figure 8A:
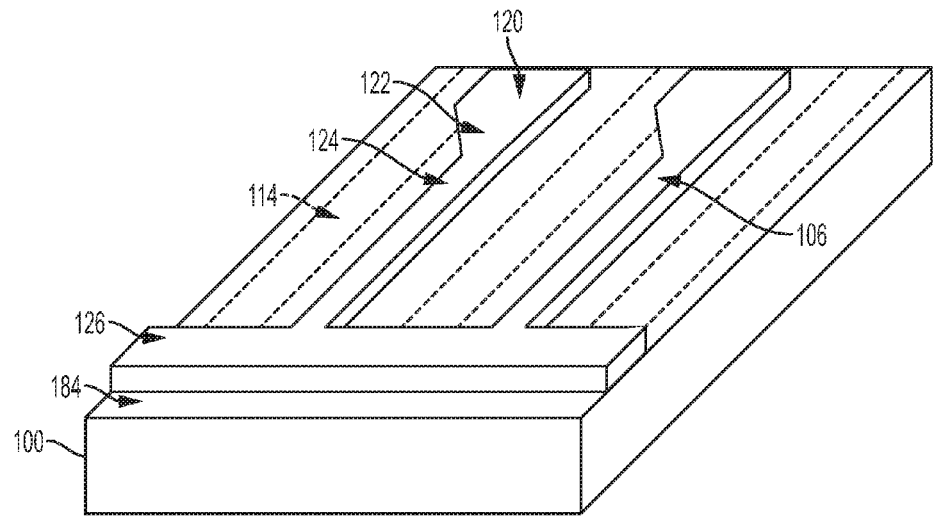
FIGS. 8A and 8B are schematic perspective diagrams of an integrated circuit device according to embodiments herein.
Figure 8B:
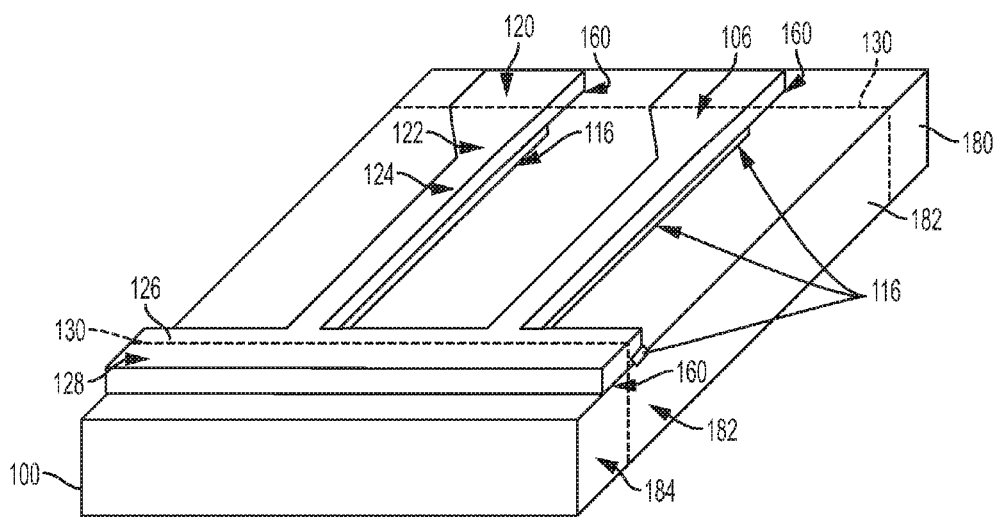
Figure 9A:
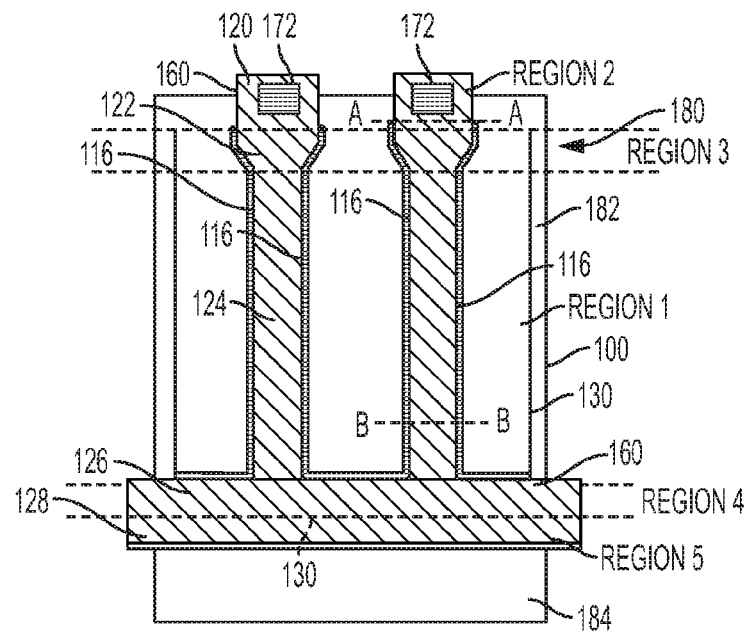
FIGS. 9A-9C are schematic top-view diagrams of an integrated circuit device according to embodiments herein.
Figure 9B:
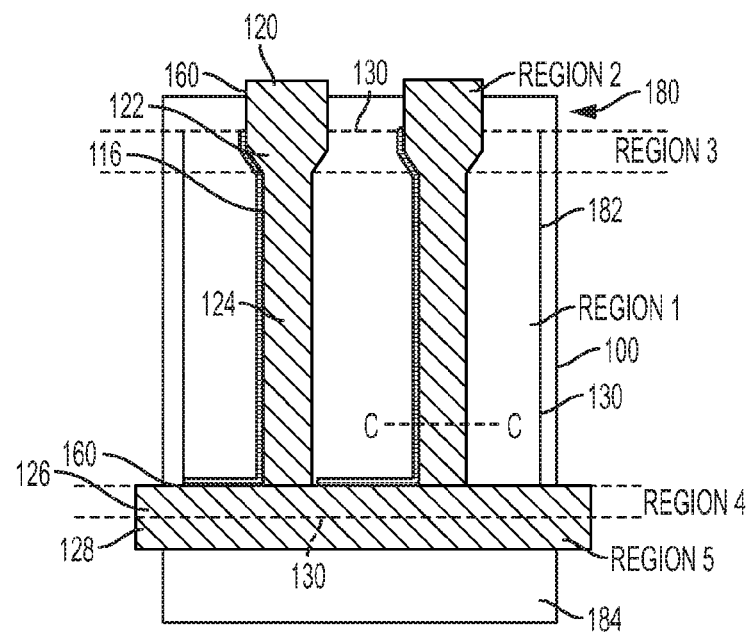

Note that FIGS. 2-4A are schematic drawings showing a cross-sectional view of the structure shown in FIG. 9A (shown in top-view) along line B-B. FIG. 4B is a schematic drawing showing a cross-sectional view of the structure shown in FIG. 9A (shown in top-view) along line A-A. Similarly, FIGS. 5-7 are schematic drawings showing a cross-sectional view of the structure shown in FIG. 9B (shown in top-view) along line C-C. FIGS. 8A-8B illustrate the same structure from FIGS. 9A-9B in perspective view.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

In item 200 in FIG. 1, these methods also dope the active region 182 to form a semiconductor channel area 102 (FIG. 2) The channel area is technically located under the gate conductor only. The doped region prior to forming the gate conductor is called the well and regions outside gate conductor will eventually be counterdoped to form source-drain regions, thus 102 technically includes the channel and the source/drain regions. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

Figure 2:
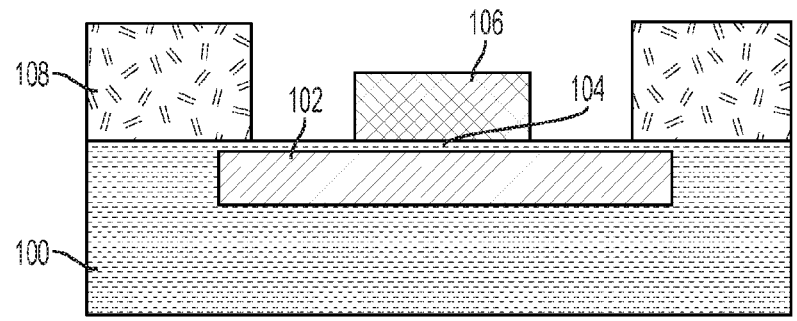
FIG. 2 is a schematic cross-sectional diagram of an integrated circuit device according to embodiments herein.

As shown in item 202 in FIG. 1 (and in FIG. 2), these methods grow a gate insulator 104 directly on the channel area 102. Further, as shown in item 204 in FIG. 1 (and in FIG. 2), these methods pattern a gate conductor 106 directly on the gate insulator 104. As shown in FIG. 2, the gate insulator 104 is between (and directly, physically contacts) the gate conductor 106 and the channel area 102. As shown, the gate conductor 106 has a flat surface in the horizontal plane that contacts the gate insulator 104 and has sidewalls in the vertical plane that are perpendicular to that flat surface. The gate conductor is said to have "corners" where such sidewalls in the vertical plane meet this flat surface that is in the horizontal plane.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions are rinsed off) or negative resist (illuminated portions remain). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

This processing in item 204 can pattern the gate conductor 106 to extend from the active region 182 to the isolation region 180 and body contact region 184, as shown in FIGS. 8A-9C. Note that FIGS. 8A-8B illustrate the same structure; however, the source and drain regions 114 illustrated in FIG. 8A have been removed from FIG. 8B (for clarity); and FIG. 8B illustrates the thicker insulator 116 formed in the undercut regions 110 at the gate conductor 106 corners, and the thinner insulator 160 (FIG. 4B) formed outside the undercut regions 110 at the gate conductor 106 corners. In addition, FIG. 8B illustrates the location of the isolation region 180, body contact region 184 and the active region 182.

As shown in FIGS. 8A-9C, the gate conductor 106 can be patterned in item 204 (FIG. 1) to have a first section 124, a second section 122, and a third section 120. As also shown in FIGS. 8A-9C, the second section 122 of the gate conductor 106 is between the first section 124 and the third section 120 of the gate conductor 106 (in the first or horizontal plane). As additionally shown in FIGS. 8A-9C, the first section 124 of the gate conductor 106 is within the active region 182 and has a first width; the third section 120 of the gate conductor 106 is within the isolation region 180 and has a second width that is greater than the first width; and the second section 122 of the gate conductor 106 is within the active region 182, and has a tapered width that tapers from the first width to the second width.

Figure 3:
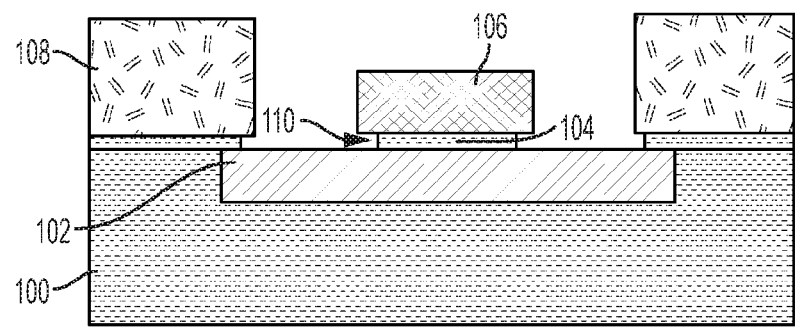
FIG. 3 is a schematic cross-sectional diagram of an integrated circuit device according to embodiments herein.

As shown in item 206 in FIG. 1 and by item 110 in FIGS. 2-3, these methods form undercut regions 110 in the first section 124 and the second section 122 of the gate conductor 106, where the corner of the gate conductor 106 contacts the gate insulator 104, using a mask 108. However, undercut regions 110 are not formed in the third section 120 of the gate conductor 106 (by way of a mask protecting the third section 120 during the undercutting process) as shown in FIG. 4B.

Figure 4A:
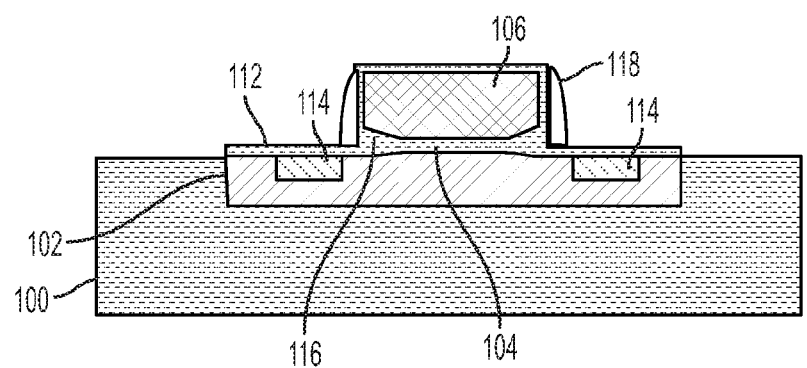
FIGS. 4A and 4B are schematic cross-sectional diagrams of an integrated circuit device according to embodiments herein.
Figure 4B:
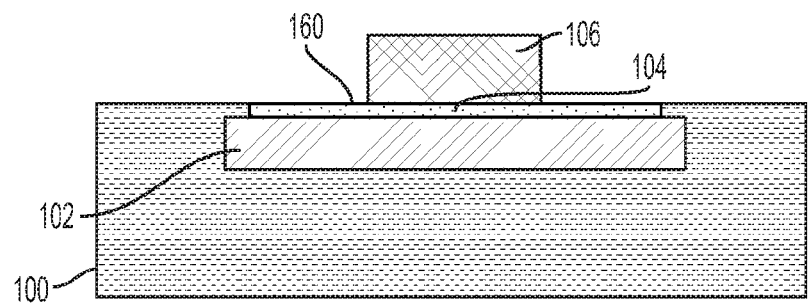

Then, in item 208 in FIG. 1 (and as shown in FIG. 4A) such methods form additional amounts 112 of the gate insulator 104 in the undercut regions 110. As shown in FIG. 4A, the gate insulator 116 is relatively thicker in the undercut regions 110 and is relatively thinner where the corner of the gate conductor 106 lacks the undercut regions 160 (FIG. 4B) in the isolation region 180 and body contact region 184. The size of the undercut regions 110, and the difference in thickness of the gate insulator 116 in the undercut regions 110 (FIG. 4A) relative to where the corner of the gate conductor 106 lacks the undercut regions 160 in the isolation region 180 and body contact region 184 (FIG. 4B), control overlap capacitance, breakdown voltage, and gate-induced drain leakage current of the transistor structure. Note that a comparison of gate insulator thickness can also be made between 116 and 104, where 116 is thick to reduce overlap capacitance and increase the breakdown voltage, and the original (unmodified) thickness gate insulator 104 is relatively thinner than the increased thickness gate insulator corner 116 to improve or maintain on resistance (Ron)). The undercut region 116 also reduces capacitance under the gate between active region and the body contact region.

In later processing, sidewall spacers 118 (FIG. 4) are formed in item 210. In item 212, these methods dope the active region 182 to form source and drain areas 114 (the channel area 102 is between the source area and the drain area 114, as shown in FIG. 4). Such processing can form electrical contacts 172 (FIG. 9A) connected to the third section 120 of the gate conductor 106 (item 214, FIG. 1), etc.

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Thus, as shown above, within a transistor, the semiconductor (or channel region) 102 is positioned between a conductive source and drain regions 114 and when the semiconductor is in a conductive state, the semiconductor allows electrical current to flow between the source and drain. The gate 106 is a conductive element that is electrically separated from the semiconductor by the gate oxide 104 (which is an insulator) and current/voltage within the gate changes the conductivity of the channel region of the transistor. Note, that many of the features shown in FIG. 4A (sidewall spacers, source and drain, etc.) are not illustrated in the other drawings for clarity; however, one ordinarily skilled in the art would understand that all of the structures herein could include such features, as well as additional elements, such as encapsulating insulators, contacts, back gates, body contacts, diffusion regions, extension implants, etc.; and such features are intentionally omitted from the drawings in order to allow the drawings to clearly show the salient features being presented herein.

Note, that while FIGS. 2-5 and 9A illustrates that the thicker gate insulator portion 116 could be formed on both sides of the gate conductor 106, with some structures herein, the thicker gate oxide may be formed on only one side of the gate conductor 106. Therefore, as shown in FIGS. 5-7 and 9B (and generic FIGS. 8A-8B), the gate conductor 106 has sides, one of the sides is oriented toward the source area 114, and the other side is oriented toward the drain area 114. Thus, the undercut regions 110 may be formed on only one of the sides of the gate conductor 106 (e.g., only on the drain side or the source side) by utilizing a different shaped mask 164 that protects one side of the gate conductor 106 as shown in FIGS. 5 and 6. More specifically, the mask 164 only exposes one side of the gate conductor 106 during the undercut process 206, which causes the undercut region 110 to only be formed on one side of the gate conductor 106.

Figure 9C:
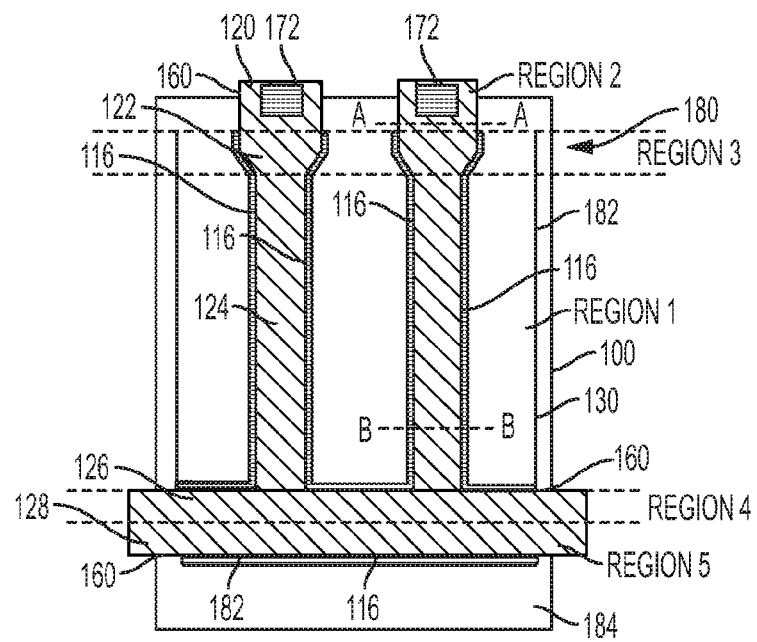

FIG. 9C illustrates a structure that is similar to the structure shown in FIG. 9A, except in FIG. 9C, the active area 182 includes the full width of the perpendicular gate conductor 126, 128. Therefore, the thicker gate installation portion 116 is formed along the gate corner of region 5 that is within the active area 182 (and the standard (less thick) gate insulation portion 160 is formed outside the active area 182).

FIGS. 8A-9C also illustrates that the process of growing the gate insulator 202 may grow gate insulator 104 in a second area (may grow a second gate insulator 104). Correspondingly, the patterning of the gate conductor 204 may pattern additional conductive material (e.g., may pattern a second gate conductor 126 positioned perpendicular to the gate conductor 106). Again, the second gate insulator 104 contacts and is between the substrate 100 and the second gate conductor 126. The second gate conductor 126 is patterned to connect the relatively perpendicular (being perpendicular to one another in the horizontal plane) gate conductor 106 of adjacent transistor structures.

The second gate conductor 126 is patterned to have a fourth section 126 within the active region 182 and a fifth section 128 within the body contact region 184. The process of forming undercut regions 110 forms the fourth section 126 of the gate conductor 106 to have undercut regions 110 where the second gate conductor 126 contacts the second gate insulator 104, but this undercut processing masks the fifth section 128 of the second gate conductor 126 to avoid forming undercut regions 110 in area 160. Also, the process of forming additional amounts 112 of the gate insulator 104 in the undercut regions 110 forms the second gate insulator 116 thicker in the undercut regions 110 and relatively thinner where the second gate conductor lacks the undercut regions 110 in the isolation region 180 and body contact region 184 (in area 160, see FIG. 4B).

Figure 10:
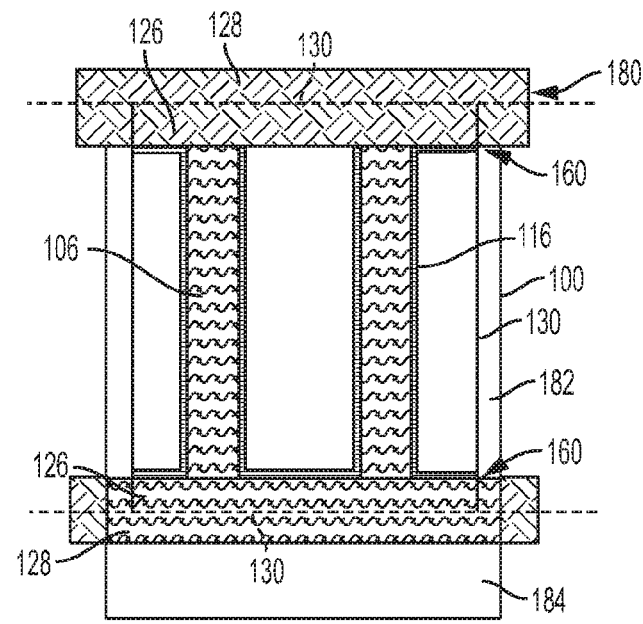
FIG. 10 is a schematic top-view diagram of an integrated circuit device according to embodiments herein.
Figure 11:
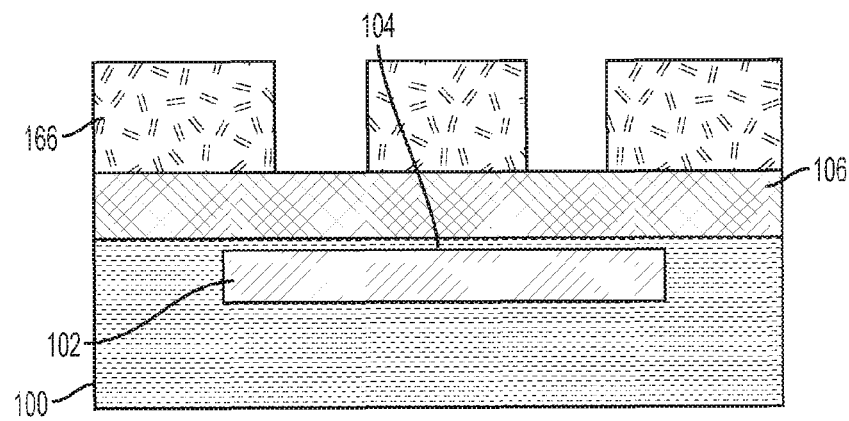
FIG. 11 is a schematic cross-sectional diagram of an integrated circuit device according to embodiments herein.
Figure 12:
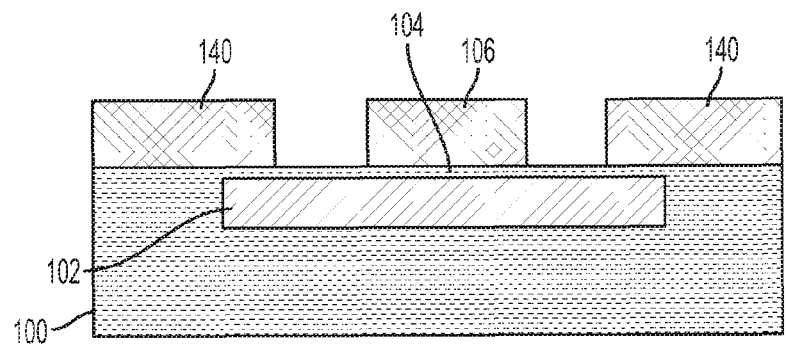
FIG. 12 is a schematic cross-sectional diagram of an integrated circuit device according to embodiments herein.
Figure 13:
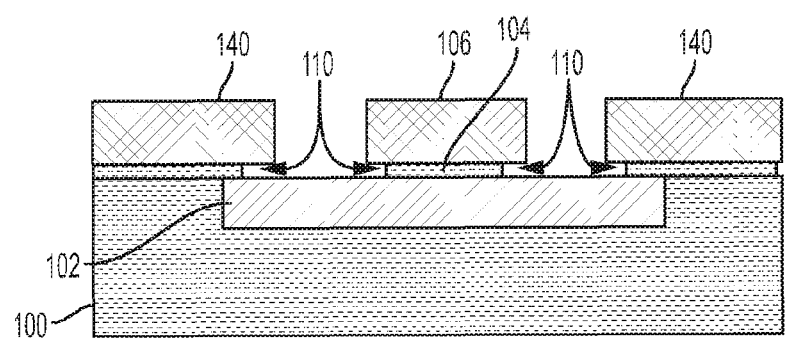
FIG. 13 is a schematic cross-sectional diagram of an integrated circuit device according to embodiments herein.

FIG. 10 illustrates a top view of alternative "H" shaped gate structures where perpendicular gates 106 and 126 are utilized. In a similar manner to that shown in FIGS. 9A-9B, portions of the gates 128 are outside the active area 182 (in the body contact region 184) and such areas 160 are prevented from having the thicker gate oxide 116 that is in the active area 182. Additionally, in FIGS. 9A-10, item 130 illustrates the mask (e.g., photo level mask) that is utilized to control the location of the undercut regions 110. Thus, mask 130 limits the location of the undercut regions 110 to the active area of 182 and, as illustrated in the drawings by the distinctions between item 116 and 160, undercut regions are not formed outside mask 130.

Figure 14:
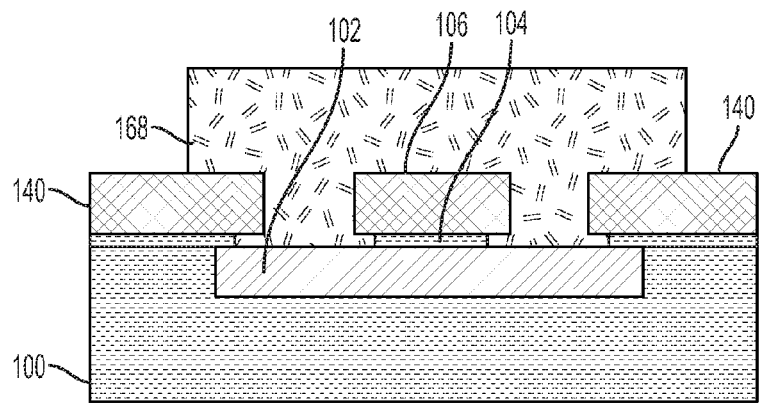
FIG. 14 is a schematic cross-sectional diagram of an integrated circuit device according to embodiments herein.
Figure 15:
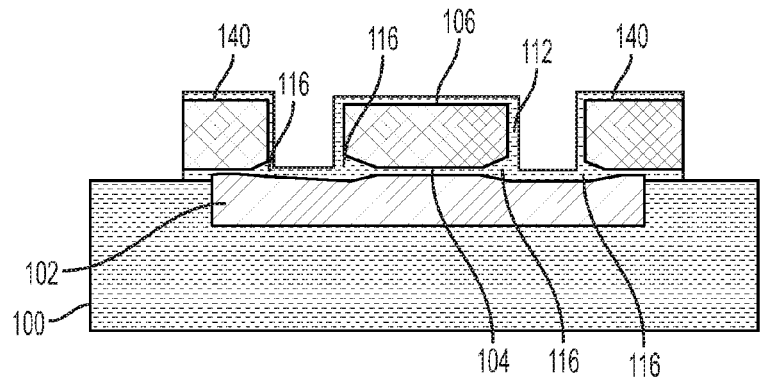
FIG. 15 is a schematic cross-sectional diagram of an integrated circuit device according to embodiments herein.
Figure 16:
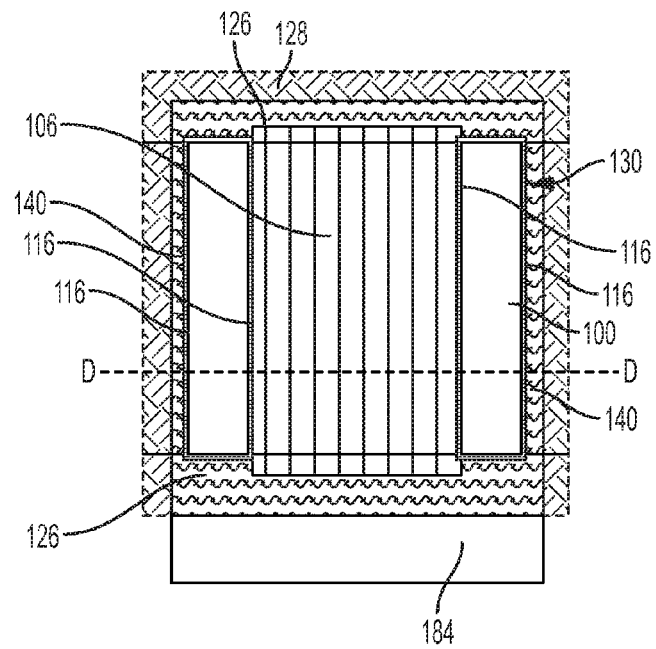
FIG. 16 is a schematic top-view diagram of an integrated circuit device according to embodiments herein.
Figure 17:
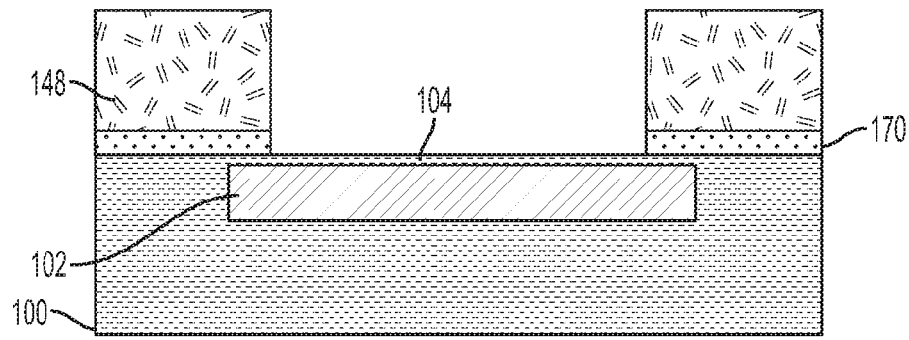
FIG. 17 is a schematic cross-sectional diagram of an integrated circuit device according to embodiments herein.
Figure 18:
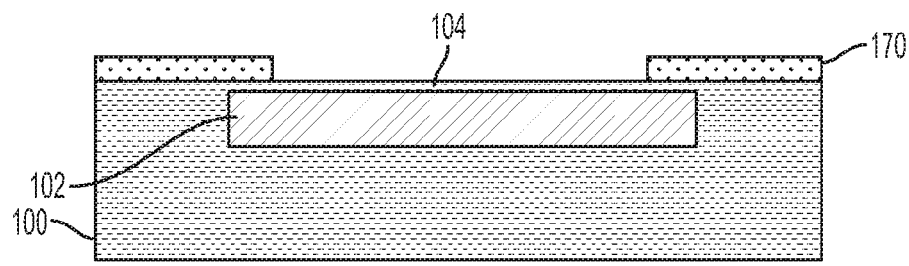
FIG. 18 is a schematic cross-sectional diagram of an integrated circuit device according to embodiments herein.
Figure 19:
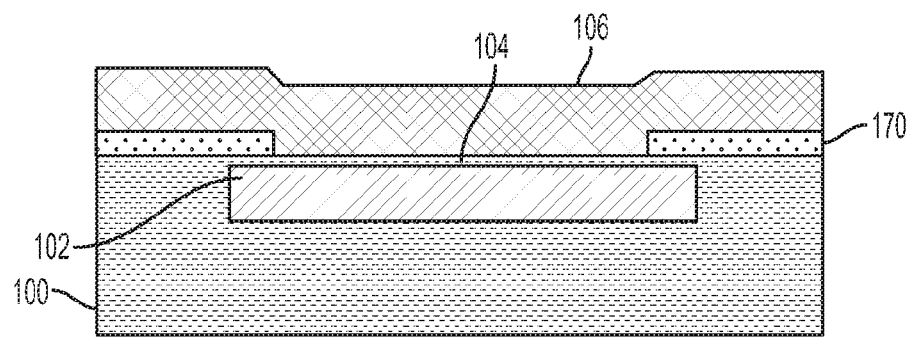
FIG. 19 is a schematic cross-sectional diagram of an integrated circuit device according to embodiments herein.
Figure 20:
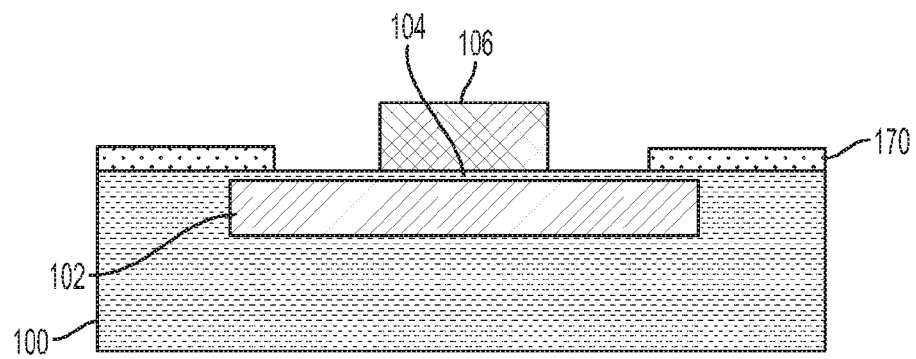
FIG. 20 is a schematic cross-sectional diagram of an integrated circuit device according to embodiments herein.
Figure 21:
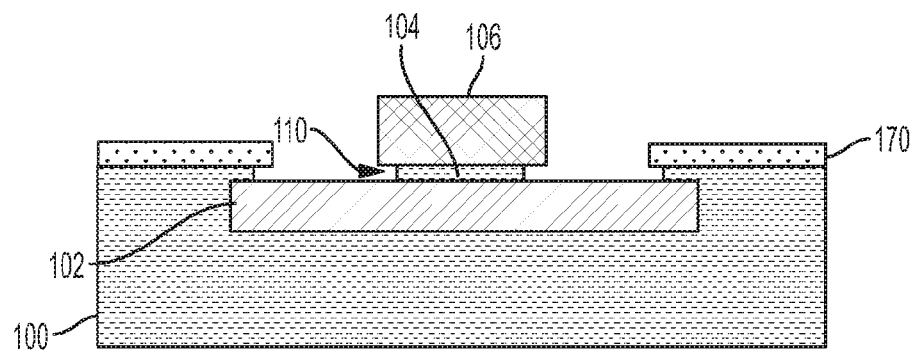
FIG. 21 is a schematic cross-sectional diagram of an integrated circuit device according to embodiments herein.
Figure 22A:
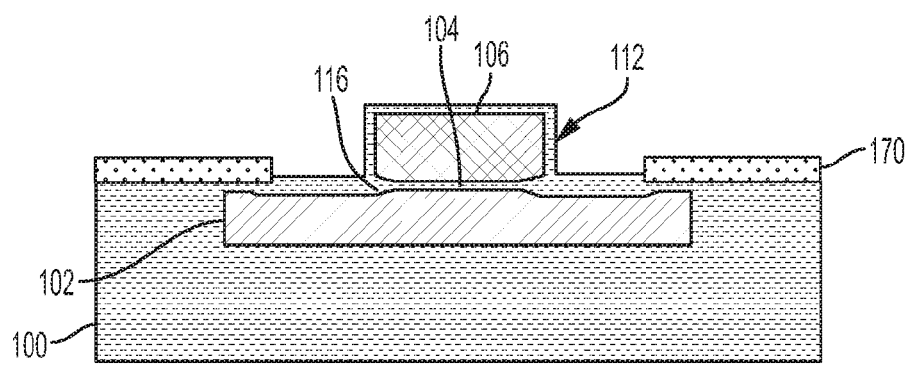
FIGS. 22A and 22B are schematic cross-sectional diagrams of an integrated circuit device according to embodiments herein.
Figure 22B:
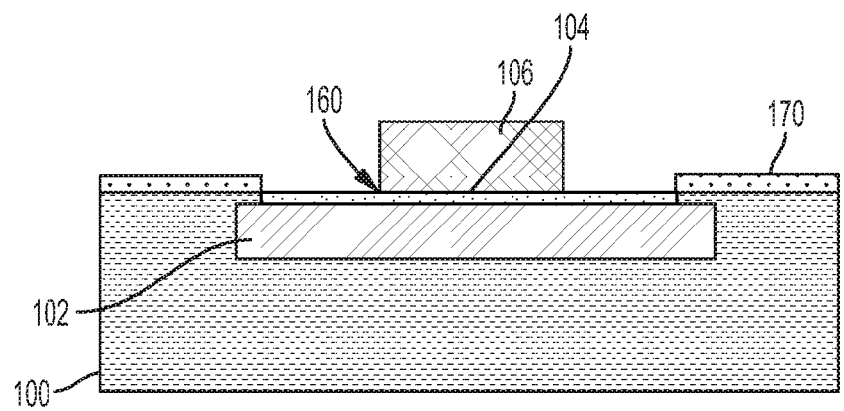
Figure 23:
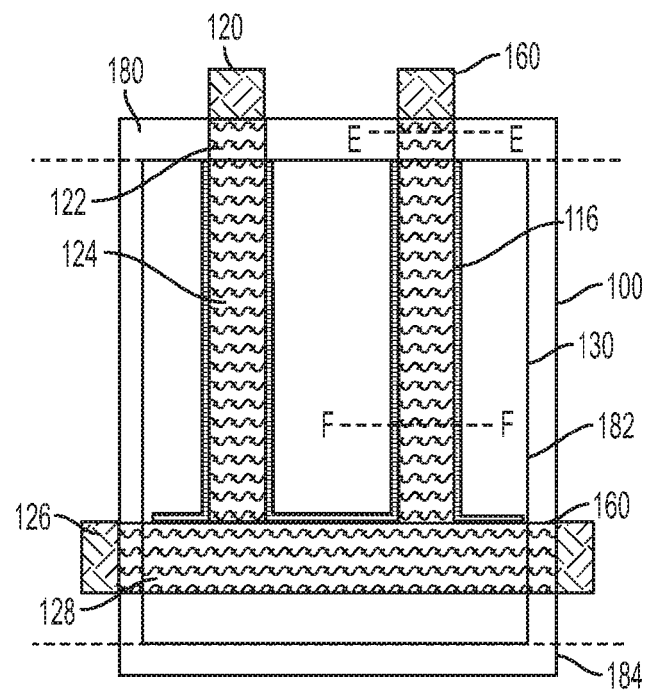
FIG. 23 is a schematic top-view diagram of an integrated circuit device according to embodiments herein.

FIGS. 11-15 illustrate cross-sectional views (a long line D-D in top-view FIG. 16) where a different shaped mask 166 (FIG. 11) is utilized to form multiple gates 106, 140 (FIG. 12) and where multiple undercut regions 110 (FIG. 13) are formed only on sides of the middle gate 106 and on sides of the exterior gates 140 that face the middle gate. Further, FIG. 14 illustrates an additional mask 168 used to thin the outer gates 140, resulting in the structure having gate corners with increased insulator thickness 116, as shown in FIGS. 15 and 16.

FIGS. 17-22A illustrate cross-sectional views (a long line F-F in top view FIG. 23) where a nitride layer 170 is incorporated into the structure and process discussed above with respect to FIGS. 2-4. FIG. 22B illustrates a cross-sectional view (along line E-E in top view FIG. 23). More specifically, the nitride layer 170 is patterned using mask 148 (FIG. 17) to produce the structure shown in FIG. 18. The gate conductor 106 is formed (FIG. 19) and the gate conductor 106 is patterned (FIG. 20) as discussed above. The undercut regions 110 are formed (FIG. 21) and the thicker gate oxide regions 116 are formed (FIG. 21) as discussed above. As with FIG. 4B, discussed above, FIG. 22B shows the corners of the gate conductor 106 that were not undercut and that have the thinner gate insulator 160. The same structure is shown in top view in FIG. 23.

Thus, as shown above, exemplary transistor structures herein include, among other components, a substrate 100 having an active region 182 bordered by an isolation region 180 and body contact region 184. The active region 182 has a channel area 102, and source and drain areas 114, and the channel area 102 is between the source area and the drain area 114 relative to the horizontal plane that is parallel to the top surface of the substrate 100. The channel area 102 is an area of the substrate 100 doped as a semiconductor of one conductivity type, and the source and drain areas 114 are areas of the substrate 100 doped as conductors of a second conductivity type. Additionally, a gate insulator 104 is on (and contacts) the channel area 102, and a gate conductor 106 is on (and contacts) the gate insulator 104. The gate insulator 104 is between the gate conductor 106 and the channel area 102 relative to a second, vertical plane that is perpendicular to the horizontal plane.

The gate conductor 106 extends from the active region 182 to the isolation region 180 and body contact region 184 relative to the horizontal plane. The gate conductor 106 has a first section 124, a second section 122, and a third section 120. The second section 122 of the gate conductor 106 is between the first section 124 and the third section 120 of the gate conductor 106 relative to the horizontal plane. The first section 124 of the gate conductor 106 is within the active region 182 and has a first width relative to the horizontal plane. The third section 120 of the gate conductor 106 is within the isolation region 180 and has a second width relative to the horizontal plane that is greater than the first width. The third section 120 of the gate conductor 106 is a location for formation of electrical contacts 172 to the gate conductor 106. The second section 122 of the gate conductor 106 is within the active region 182 and has a tapered width relative to the horizontal plane that tapers from the first width to the second width.

The first section 124 and the second section 122 of the gate conductor 106 have undercut regions 110 where the corner of the gate conductor 106 contacts the gate insulator 104. The third section 120 of the gate conductor 106 lacks the undercut regions 110. The gate conductor 106 has sides, one of the sides is oriented toward the source area and another of the sides is oriented toward the drain area 114, and the undercut regions 110 may be on both sides of the gate conductor 106, or may only be on one of the sides of the gate conductor 106 (e.g., only on the drain side or the source side). The gate insulator 104 is relatively thicker (116) in the undercut regions 110 and is relatively thinner (160) where the corner of the gate conductor 106 lacks the undercut regions 110 in the isolation region 180 and body contact region 184.

The size of the undercut regions 110, and the difference in thickness (116 vs. 160) of the gate insulator 104 in the undercut regions 110 relative to where the corner of the gate conductor 106 lacks the undercut regions 110 in the isolation region 180 and body contact region 184, control overlap capacitance, breakdown voltage, and gate-induced drain leakage current of the transistor structure.

Additionally, such transistor structures can include a second gate conductor 106 positioned perpendicular (within the horizontal plane) to the gate conductor 106. The second gate conductor 106 connects the gate conductor 106 of adjacent transistor structures. Similarly, a second gate insulator 104 contacts and is between the substrate 100 and the second gate conductor 106. The second gate conductor 106 has a fourth section 126 within the active region 182 and a fifth section 128 within the body contact region 184. The fourth section 126 of the gate conductor 106 has undercut regions 110 where the second gate conductor 106 contacts the second gate insulator 104. As with the other undercut regions 110, the second gate insulator 104 is thicker in the undercut regions 110 and is relatively thinner where the second gate conductor 106 lacks the undercut regions 110 in the fifth section 128 within the body contact region 184.

The resulting transistors can be included in integrated circuit chips and can be distributed by a fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate having an active region bordered by an isolation region;
a gate insulator on a surface of the substrate;
a gate conductor on and contacting the gate insulator;
a second gate conductor positioned perpendicular to the gate conductor; and
a second gate insulator contacting and between the substrate and the second gate conductor,
the gate conductor extends in a horizontal direction parallel to the surface from the active region to the isolation region,
the gate conductor has a first section, a second section, and a third section in the horizontal direction,
the second section of the gate conductor is between the first section and the third section of the gate conductor in the horizontal direction,
the first section of the gate conductor is within the active region and has a first width in the horizontal direction,
the third section of the gate conductor is within the isolation region and has a second width in the horizontal direction that is greater than the first width,
the second section of the gate conductor is within the active region and has a tapered width in the horizontal direction that tapers from the first width to the second width,
the first section and the second section of the gate conductor each have an undercut region where a corner of the gate conductor contacts the gate insulator,
the third section of the gate conductor lacks the undercut region,
the gate insulator is relatively thicker in the undercut region of the active region and is relatively thinner where the corner of the gate conductor lacks the undercut region in the isolation region,
the gate conductor has sides, one of the sides is oriented toward a source region and another of the sides is oriented toward a drain region, and the undercut region is only on one of the sides of the gate conductor,
the second gate conductor has a fourth section within the active region and a fifth section within a body contact region,
the fourth section of the second gate conductor faces the first section of the gate conductor and has an undercut region where the second gate conductor contacts the second gate insulator, and
the second gate insulator is thicker in the undercut region of the active region and is relatively thinner where the second gate conductor lacks the undercut region in the body contact region.

2. The structure according to claim 1, the second gate conductor connects gate conductors of adjacent structures.

3. The structure according to claim 1, further comprising electrical contacts connected to the third section of the gate conductor.

4. The structure according to claim 1, the substrate further comprises a channel area comprising a semiconductor, and a source area and a drain area comprising conductors.

5. A structure comprising:
a substrate having an active region bordered by an isolation region, the active region has a channel area, a source area, and a drain area, and the channel area is between the source area and the drain area relative to a horizontal direction;
a gate insulator on and contacting the channel area;
a gate conductor on and contacting the gate insulator;
a second gate conductor positioned perpendicular to the gate conductor; and
a second gate insulator contacting and between the substrate and the second gate conductor,
the gate insulator is between, relative to a vertical direction, the gate conductor and the channel area,
the vertical direction is perpendicular to the horizontal direction,
the gate conductor extends from the active region to the isolation region in the horizontal direction,
the gate conductor has a first section, a second section, and a third section in the horizontal direction,
the second section of the gate conductor is between the first section and the third section of the gate conductor in the horizontal direction,
the first section of the gate conductor is within the active region and has a first width in the horizontal direction,
the third section of the gate conductor is within the isolation region and has a second width in the horizontal direction that is greater than the first width,
the second section of the gate conductor is within the active region and has a tapered width in the horizontal direction that tapers from the first width to the second width,
the first section and the second section of the gate conductor each have an undercut region where a corner of the gate conductor contacts the gate insulator,
the third section of the gate conductor lacks the undercut region,
the gate insulator is relatively thicker, in the vertical direction, in the undercut region of the active region and is relatively thinner, in the vertical direction, where the corner of the gate conductor lacks the undercut region in the isolation region,
the gate conductor has sides, one of the sides is oriented toward the source area and another of the sides is oriented toward the drain area, and the undercut region is only on one of the sides of the gate conductor,
the second gate conductor has a fourth section within the active region and a fifth section within a body contact region,
the fourth section of the second gate conductor faces the first section of the gate conductor and has an undercut region where the second gate conductor contacts the second gate insulator, and
the second gate insulator is thicker in the undercut region of the active region and is relatively thinner where the second gate conductor lacks the undercut region in the body contact region.

6. The structure according to claim 5, the second gate conductor connects gate conductors of adjacent structures and separates the active region from the body contact region.

7. The structure according to claim 5, further comprising electrical contacts connected to the third section of the gate conductor.

8. The structure according to claim 5, the substrate further comprises a channel area comprising a semiconductor, and a source area and a drain area comprising conductors.

9. A structure comprising:
a substrate having an active region bordered by an isolation region;
a gate insulator on a surface of the substrate;
a gate conductor on and contacting the gate insulator;
a second gate conductor positioned perpendicular to the gate conductor; and
a second gate insulator contacting and between the substrate and the second gate conductor,
the gate conductor extends in a horizontal direction parallel to the surface, from the active region to the isolation region,
the gate conductor has a first section, a second section, and a third section, in the horizontal direction,
the second section of the gate conductor is between the first section and the third section of the gate conductor in the horizontal direction,
the first section of the gate conductor is within the active region and has a first width,
the third section of the gate conductor is within the isolation region and has a second width that is greater than the first width,
the second section of the gate conductor is within the active region and has a tapered width that tapers from the first width to the second width,
the first section and the second section of the gate conductor each have an undercut region where a corner of the gate conductor contacts the gate insulator,
the gate conductor has a reduced thickness, measured in a vertical direction perpendicular to the surface of the substrate, in the undercut region, relative to a larger thickness in the third section of the gate conductor that lacks the undercut region,
the gate insulator is relatively thicker, in the vertical direction, in the undercut region in the active region and is relatively thinner, in the vertical direction, where the corner of the gate conductor lacks the undercut region in the isolation region,
the gate conductor has sides, one of the sides is oriented toward a source region and another of the sides is oriented toward a drain region, and the undercut region is only on one of the sides of the gate conductor,
the second gate conductor has a fourth section within the active region and a fifth section within a body region,
the fourth section of the second gate conductor faces the first section of the gate conductor and has an undercut region where the second gate conductor contacts the second gate insulator, and
the second gate insulator is thicker in the undercut region of the active region and is relatively thinner where the second gate conductor lacks the undercut region in the body region.

10. The structure according to claim 9, the second gate conductor connects gate conductors of adjacent structures.

11. The structure according to claim 9, further comprising electrical contacts connected to the third section of the gate conductor.

* * * * *